(12) United States Patent
Tsai

(10) Patent No.: US 9,173,313 B2
(45) Date of Patent: Oct. 27, 2015

(54) WATERPROOF STRUCTURE OF A CASING

(71) Applicant: Yu-Jen Tsai, Hsinchu County (TW)

(72) Inventor: Yu-Jen Tsai, Hsinchu County (TW)

(73) Assignee: Gemtek Technology Co., Ltd., Hsinchu County (TW)

( * ) Notice: Subject to any disclaimer, the term of this patent is extended or adjusted under 35 U.S.C. 154(b) by 388 days.

(21) Appl. No.: 13/633,935

(22) Filed: Oct. 3, 2012

(65) Prior Publication Data

US 2013/0293073 A1 Nov. 7, 2013

(30) Foreign Application Priority Data

May 4, 2012 (TW) .............................. 101208422 U

(51) Int. Cl.
*H05K 5/03* (2006.01)
*H05K 5/06* (2006.01)
*H05K 5/02* (2006.01)

(52) U.S. Cl.
CPC .............. *H05K 5/061* (2013.01); *H05K 5/0239* (2013.01)

(58) Field of Classification Search
USPC .......... 220/849, 4.02, 3.7, 3.8, 378, 810, 820, 220/254.3, 254.1, 254.6; 312/229, 296; 361/679.56, 579.55, 679.3, 679.02; 174/559, 520, 50.5; 455/558, 575.1, 455/575.8

See application file for complete search history.

(56) References Cited

U.S. PATENT DOCUMENTS

2011/0199720 A1* 8/2011 Kajiyama et al. ........ 361/679.01

* cited by examiner

*Primary Examiner* — Mickey Yu
*Assistant Examiner* — Allan Stevens
(74) *Attorney, Agent, or Firm* — Alan D. Kamrath; Kamrath IP Lawfirm, P.A.

(57) ABSTRACT

A waterproof structure of a casing has a case body and a cover pivotally mounted on the case body. The case body has a recess, a water collecting sump defined in the recess and two abutting protrusions respectively formed on two opposite inner sidewalls of the case body. The cover has an outer shell, and an inner stop and two side stops formed on an inner surface of the outer shell. When the cover pivots to cover the recess of the case body, the inner stop and the side stops prevent moisture and dust from entering the case body from a clearance formed between a pivot edge of the outer shell and the water collecting side surface of the case body.

15 Claims, 5 Drawing Sheets

WATERPROOF STRUCTURE OF A CASING

BACKGROUND OF THE INVENTION

1. Field of the Invention

The present invention relates to a waterproof structure of a casing and, especially, to a waterproof structure that prevents moisture and dust from entering a casing from where a case body and a cover of the casing pivotally connect to each other.

2. Description of the Prior Art(s)

A smart card, such as a subscriber identity module (SIM) card, a memory card or the like, is inserted in a portable electronic device, such as a mobile phone, a tablet computer, a digital camera, a personal digital assistant (PDA) or the like, to allow the portable electronic device to read data stored in the smart card.

A conventional electronic device has a case body and a cover. The case body has a slot formed in the case body. The cover selectively covers the slot of the case body. Preferably, the cover has a pivot edge pivotally connected to the case body. Thus, when the cover pivots to reveal the slot, the smart card is capable of being inserted into the slot of the case body to connect with electronic elements in the conventional electronic device. Then the cover pivots reversely to cover the slot of the case body so the smart card is stored in the slot of the case body.

However, since the cover is pivotally mounted on the case body, a clearance of about 0.3 millimeter (mm) between the pivot edge of the cover and the case body has to be reserved to allow the cover to pivot relative to the case body. Thus, moisture and dust inevitably enter the case body through the clearance and damage the electronic elements inside the case body. Consequently, the conventional electronic device is unable to pass an electro static discharge (ESD) test.

To overcome the shortcomings, the present invention provides a waterproof structure of a casing to mitigate or obviate the aforementioned problems.

SUMMARY OF THE INVENTION

The main objective of the present invention is to provide a waterproof structure of a casing. The waterproof structure of a casing has a case body and a cover pivotally mounted on the case body. The case body has a recess, a water collecting sump defined in the recess and two abutting protrusions respectively formed on two opposite inner sidewalls of the case body. The cover has an outer shell, and an inner stop and two side stops formed on an inner surface of the outer shell.

When the cover pivots to cover the recess of the case body, the inner stop and the side stops prevent moisture and dust from entering the case body from a clearance formed between a pivot edge of the outer shell and the water collecting side surface of the case body.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
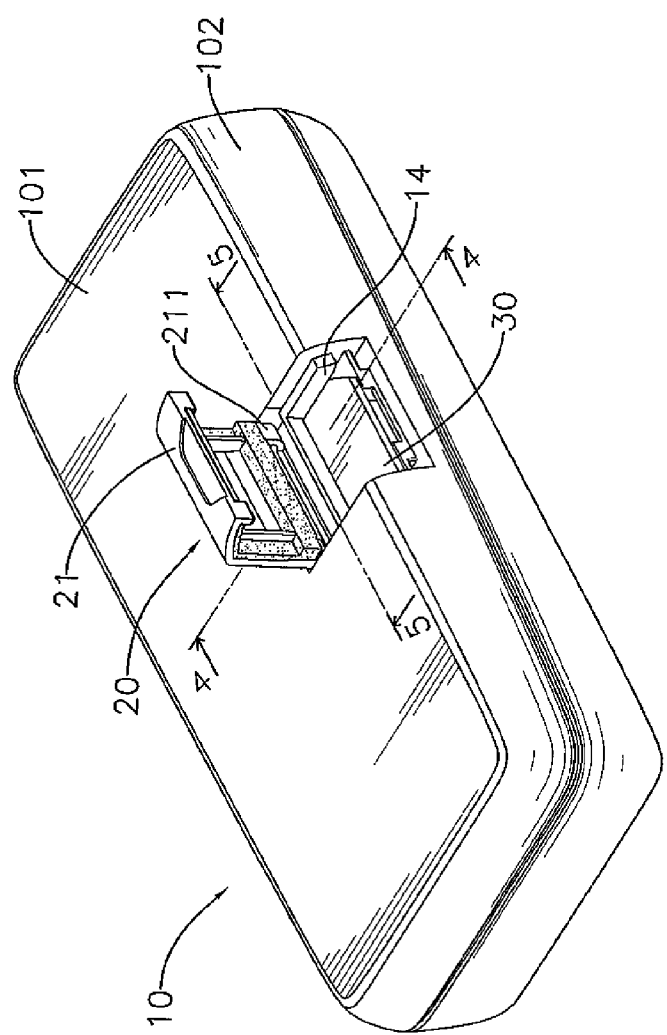
FIG. 1 is a perspective view of a waterproof structure of a casing in accordance with the present invention.

With reference to FIG. 1, a waterproof structure of a casing in accordance with the present invention comprises a case body 10 and a cover 20.

Figure 2:
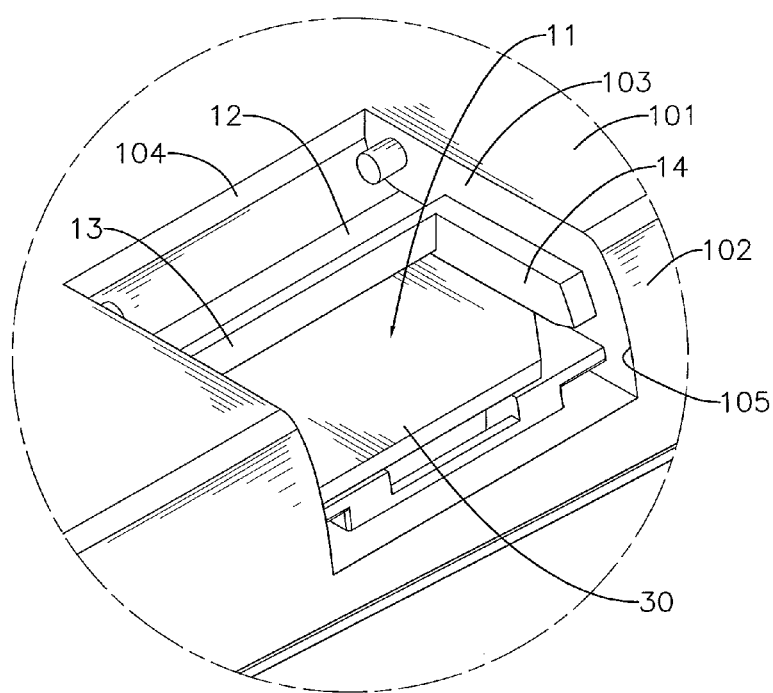
FIG. 2 is an enlarged perspective view of the waterproof structure of the casing in FIG. 1.

With further reference to FIG. 2, the case body 10 has a top surface 101, an outer side surface 102, a recess 11, two inner sidewalls 103, a water collecting side surface 104, a side opening 105, a water collecting panel 12, a shield 13, a water collecting sump 15 and two abutting protrusions 14.

The outer side surface 102 is adjacent to the top surface 101. The recess 11 is formed in the top surface 101 and is formed through the outer side surface 102. The inner sidewalls 103 are defined in the recess 11 and are opposite to each other. The water collecting side surface 104 is defined in the recess 11 and has two ends respectively connected to the inner sidewalls 103. The side opening 105 is formed on the outer side surface 102 and is opposite to the water collecting side surface 104.

Figure 4:
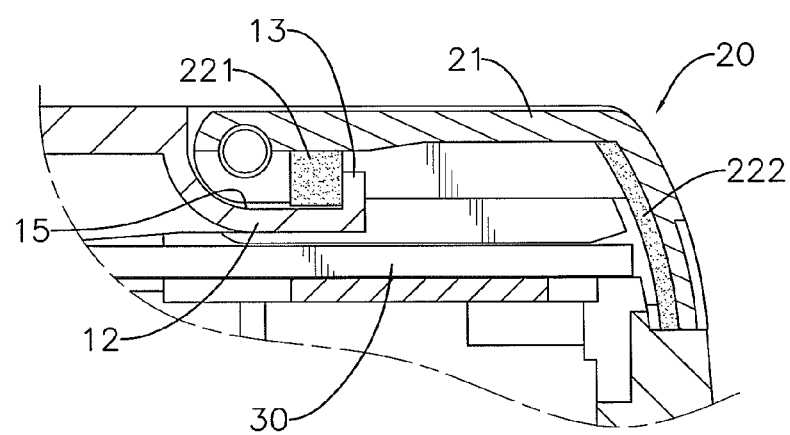
FIG. 4 is an enlarged side view in partial section of the waterproof structure of the casing in FIG. 1.

With further reference to FIG. 4, the water collecting panel 12 is formed on and protrudes from the water collecting side surface 104, protrudes toward the side opening 105 and has a distal edge and two ends. The ends of the water collecting panel 12 are respectively connected to the inner sidewalls 103.

The shield 13 is formed on the water collecting panel 12 and is disposed along the distal edge of the water collecting panel 12. The water collecting sump 15 is formed beside the water collecting side surface 104, is defined on the water collecting panel 12 and is surrounded by the inner sidewalls 103, the water collecting side surface 104 and the shield 13. The abutting protrusions 14 are respectively formed on the inner sidewall 103 of the case body 10. Each abutting protrusion 14 is elongated and has two ends. One end of each abutting protrusion 14 is connected to the shield 13. The other end of each abutting protrusion 14 protrudes toward the side opening 105.

Figure 3:
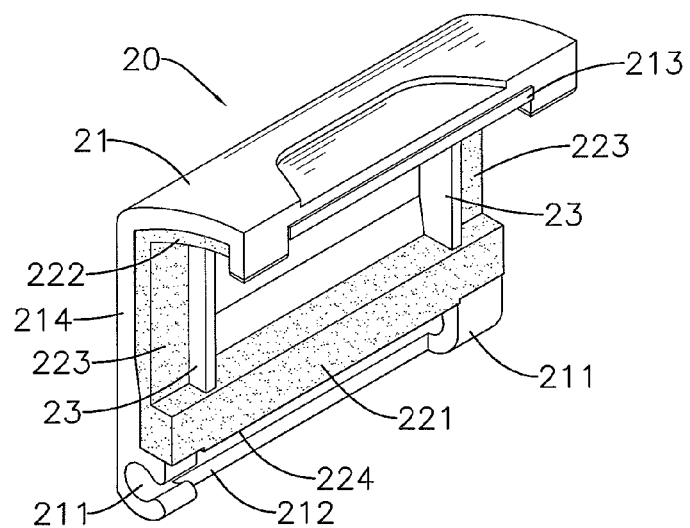
FIG. 3 is an enlarged perspective view of a cover of the casing in FIG. 1.

With further reference to FIG. 3, the cover 20 is pivotally mounted on the case body 10, selectively covers the recess 11 of the case body 10 and has an outer shell 21, two retaining protrusions 23, an inner stop 221, an outer stop 222 and two side stops 223.

The outer shell 21 has a pivot edge 212, two pivot portions 211, a distal edge 213 and two opposite side edges 214. The pivot portions 211 are respectively formed on two ends of the pivot edge 212 and are pivotally connected to the case body 10.

Figure 5:
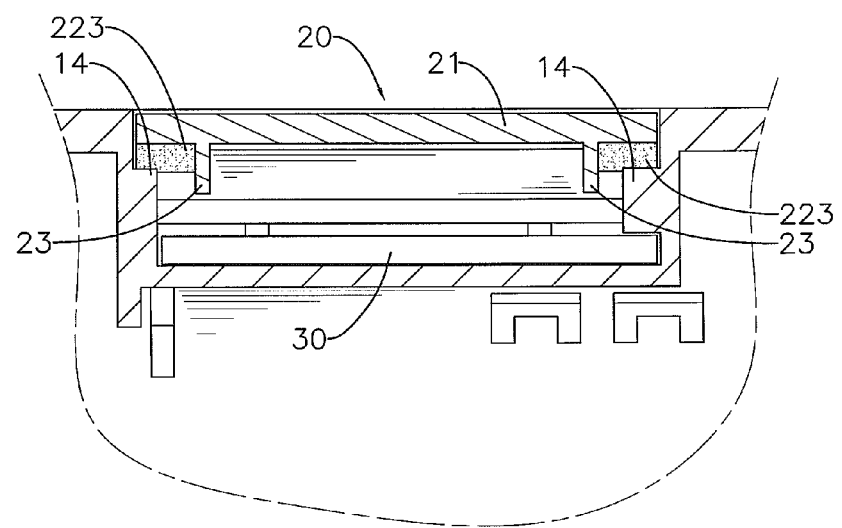
FIG. 5 is another enlarged side view in partial section of the waterproof structure of the casing in FIG. 1.

With further reference to FIG. 5, the retaining protrusions 23 are elongated, are formed on an inner surface of the outer shell 21 and are respectively disposed adjacent to and parallel to the side edges 214 of the outer shell 21.

The inner stop 221 is made of waterproof adhesive, is elongated, is formed on the inner surface of the outer shell 21, is parallel to the pivot edge 212 of the outer shell 21 and has two ends, an inner sidewall and a protrusion 224. The ends of the inner stop 221 respectively extend toward the side edges 214 of the outer shell 21. The inner sidewall of the inner stop 221 corresponds to the pivot edge 212 of the outer shell 21. The protrusion 224 is elongated, is formed on the inner sidewall of the inner stop 221 and is disposed between the pivot portions 211 of the outer shell 21.

The outer stop 222 is made of waterproof adhesive, is formed on the inner surface of the outer shell 21, is disposed adjacent to the distal edge 213 of the outer shell 21 and selectively covers the side opening 105 of the case body 10.

The side stops 223 are made of waterproof adhesive, are formed on the inner surface of the outer shell 21 and are respectively disposed adjacent to the side edges 214 of the outer shell 21. Each side stop 223 is disposed between one side edge 214 of the outer shell 21 and the retaining protrusion 23 that is adjacent to the side edge 214 of the outer shell 21, and has two ends respectively connected to the outer stop 222 and the inner stop 221.

In this preferred embodiment, the retaining protrusions 23 and the outer shell 21 are formed integrally. Alternatively, the retaining protrusions 23 may also be made of waterproof adhesive, and the retaining protrusions 23, the inner stop 221, the outer stop 222 and the side stops 223 are formed integrally on the inner surface of the outer shell 21.

With reference to FIG. 1, a smart card 30 with a subscriber identity module (SIM) is inserted into the recess 11 of the case body 10 from the side opening 105.

With further reference to FIG. 4, when the cover 20 pivots to cover the recess 11, the inner stop 221 and the protrusion 224 of the inner stop 221 abut a bottom defined in the water collecting sump 15, i.e. the water collecting panel 12, and the inner stop 221 further abuts the shield 13.

With further reference to FIG. 5, the side stops 223 of the cover 20 are respectively pressed against the abutting protrusions 14 of the case body 10. Thus, the inner stop 221 and the side stops 223 prevent moisture and dust from entering the case body 10 from a clearance formed between the pivot edge 212 of the outer shell 21 and the water collecting side surface 104 of the case body 10.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A waterproof structure of a casing comprising:
   a case body having:
      a top surface;
      a recess formed in the top surface;
      two inner sidewalls defined in the recess and being opposite to each other;
      two abutting protrusions respectively formed on the two inner sidewalls;
      a water collecting side surface defined in the recess;
      a water collecting sump formed beside the water collecting side surface; and
   a cover pivotally mounted on the case body, selectively covering the recess of the case body and having:
      an outer shell having:
         a pivot edge;
         two pivot portions respectively formed on two ends of the pivot edge and pivotally connected to the case body; and
         two opposite side edges;
      an inner stop formed on an inner surface of the outer shell, parallel to the pivot edge of the outer shell and having two ends respectively extending toward the two opposite side edges of the outer shell; and
      two side stops formed on the inner surface of the outer shell and respectively disposed adjacent to the two opposite side edges of the outer shell; wherein when the cover covers the recess of the case body, the inner stop abuts a bottom defined in the water collecting sump and the two side stops of the cover are respectively pressed against the two abutting protrusions of the case body.

2. The waterproof structure of the casing as claimed in claim 1, wherein:
   the case body further has an outer side surface being adjacent to the top surface of the case body;
   the recess of the case body is formed through the outer side surface of the case body to form a side opening on the outer side surface;
   the outer shell of the cover further has a distal edge; and
   the cover further has an outer stop formed on the inner surface of the outer shell, disposed adjacent to the distal edge of the outer shell and selectively covering the side opening of the case body.

3. The waterproof structure of the casing as claimed in claim 1, wherein:
   the case body further has a water collecting panel formed on and protruding from the water collecting side surface of the case body and having two ends respectively connected to the two inner sidewalls of the case body; and
   the water collecting sump of the case body is defined on the water collecting panel.

4. The waterproof structure of the casing as claimed in claim 2, wherein:
   the case body further has a water collecting panel formed on and protruding from the water collecting side surface of the case body, protruding toward the side opening of the case body and having two ends respectively connected to the two inner sidewalls of the case body; and
   the water collecting sump of the case body is defined on the water collecting panel.

5. The waterproof structure of the casing as claimed in claim 2, wherein the inner stop, the outer stop and the side stops of the cover are made of waterproof adhesive.

6. The waterproof structure of the casing as claimed in claim 2, wherein the inner stop of the cover further has:
   an inner sidewall corresponding to the pivot edge of the outer shell; and
   a protrusion formed on the inner sidewall of the inner stop and disposed between the two pivot portions of the outer shell.

7. The waterproof structure of the casing as claimed in claim 3, wherein the inner stop of the cover further has:
   an inner sidewall corresponding to the pivot edge of the outer shell; and
   a protrusion formed on the inner sidewall of the inner stop and disposed between the two pivot portions of the outer shell.

8. The waterproof structure of the casing as claimed in claim 4, wherein the inner stop of the cover further has:
   an inner sidewall corresponding to the pivot edge of the outer shell; and
   a protrusion formed on the inner sidewall of the inner stop and disposed between the two pivot portions of the outer shell.

9. The waterproof structure of the casing as claimed in claim 1, wherein the inner stop of the cover further has:
   an inner sidewall corresponding to the pivot edge of the outer shell; and
   a protrusion formed on the inner sidewall of the inner stop and disposed between the two pivot portions of the outer shell.

10. The waterproof structure of the casing as claimed in claim 5, wherein the inner stop of the cover further has:
  an inner sidewall corresponding to the pivot edge of the outer shell; and
  a protrusion formed on the inner sidewall of the inner stop and disposed between the two pivot portions of the outer shell.

11. The waterproof structure of the casing as claimed in claim 9, wherein the case body further has a shield formed on the water collecting panel and disposed along a distal edge of the water collecting panel; and wherein when the cover covers the recess of the case body, the inner stop of the cover abuts the shield of the case body.

12. The waterproof structure of the casing as claimed in claim 10, wherein the case body further has a shield formed on the water collecting panel and disposed along a distal edge of the water collecting panel; and wherein when the cover covers the recess of the case body, the inner stop of the cover abuts the shield of the case body.

13. The waterproof structure of the casing as claimed in claim 11, wherein:
  the cover further has two retaining protrusions formed on the inner surface of the outer shell and respectively disposed adjacent to and parallel to the two opposite side edges of the outer shell; and
  each side stop is disposed between one side edge of the outer shell and one retaining protrusion that is adjacent to the one side edge of the outer shell.

14. The waterproof structure of the casing as claimed in claim 12, wherein:
  the cover further has two retaining protrusions formed on the inner surface of the outer shell and respectively disposed adjacent to and parallel to the two opposite side edges of the outer shell; and
  each side stop is disposed between one side edge of the outer shell and one retaining protrusion that is adjacent to the one side edge of the outer shell.

15. The waterproof structure of the casing as claimed in claim 5, wherein the inner stop of the cover further has:
  an inner sidewall corresponding to the pivot edge of the outer shell; and
  a protrusion formed on the inner sidewall of the inner stop and disposed between the two pivot portions of the outer shell.

* * * * *